United States Patent [19]

Jenkins et al.

[11] Patent Number: 4,828,880

[45] Date of Patent: May 9, 1989

[54] COATINGS ON GLASS

[75] Inventors: Michael S. Jenkins, Longton; Andrew F. Simpson, Hesketh Bank; David A. Porter, Birkdale, all of England

[73] Assignee: Pilkington plc, Merseyside, England

[21] Appl. No.: 135,263

[22] Filed: Dec. 21, 1987

[30] Foreign Application Priority Data

Dec. 24, 1986 [GB] United Kingdom ............... 8630918

[51] Int. Cl.$^4$ .............................................. B05D 5/06
[52] U.S. Cl. ..................................... 427/167; 65/60.8; 427/226; 427/255; 427/255.1; 427/255.3; 427/314; 427/419.2; 427/419.3
[58] Field of Search .............. 427/226, 167, 314, 255, 427/255.1, 255.2, 255.3, 419.2, 419.3; 65/60.8

[56] References Cited

U.S. PATENT DOCUMENTS 3,306,768  2/1967  Peterson ............................. 427/167

FOREIGN PATENT DOCUMENTS

| 0071865 | 2/1983 | European Pat. Off. . |
| 0174727 | 3/1986 | European Pat. Off. . |
| 1136218 | 12/1968 | United Kingdom . |
| 1450123 | 9/1976 | United Kingdom . |
| 2031756 | 4/1980 | United Kingdom . |
| 2035986 | 6/1980 | United Kingdom . |
| 2078699 | 1/1982 | United Kingdom . |
| 2163146 | 2/1986 | United Kingdom . |

*Primary Examiner*—Janyce A. Bell
*Attorney, Agent, or Firm*—Burns, Doane, Swecker & Mathis

[57] ABSTRACT

Coatings, which act as barrier layers to inhibit migration of alkali metal ions from a glass surface and/or act as color suppressing underlayers for overlying infra-red reflecting or electrically conducting layers, are deposited by pyrolysis of a gaseous mixture of a silane, an unsaturated hydrocarbon and carbon dioxide on a hot glass surface at a temperature of 600° C. to 750° C.

19 Claims, No Drawings

COATINGS ON GLASS

BACKGROUND OF THE INVENTION

1. Field of the Invention

The invention relates to coatings, and in particular to the production of underlayers useful in the suppression of iridescence and in the protection of overlying layers sensitive to alkali metal ions from migration of such ions from an underlying glass surface.

2. Description of the Prior Art

G.B. patent no. 2 031 756B is concerned with thin transparent infra-red reflecting semiconductor coatings which are useful in improving the insulation properties of windows and which, being electrically conductive, can serve as resistance heaters, for example to remove ice or condensation from windows. According to GB 2 031 756B, the use of such coatings has been limited by the fact that they exhibit iridescence colours, especially in reflected light; these iridescence effects are widely regarded as aesthetically unsatisfactory, and the problem is made worse by the variation in iridescence colour which occurs with small variations in coating thickness. GB 2 031 756B proposes to overcome the problem of iridescence by depositing an appropriate iridescence reducing underlayer under the semiconductor coating and recommends, as a preferred form of underlayer, a layer having a refractive index in the range from 1.7 to 1.8 and a thickness in the range 64 nm and to 80 nm. According to GB 2 031 756B, the underlayers may be produced by co-depositing a mixture of components calculated to provide the required refractive index, for example a mixture of 84±3% silicon nitride and the balance silica, referred to as silicon oxynitride. Such silicon oxynitride films may be formed by chemical vapour deposition from a source of silicon (e.g. $SiH_4$, $(CH_3)_2 SiH_2$, $(C_2H_5) SiH_2$, $(CH_3)_4Si$, $SiCl_4$, $SiBr_4$), a source of oxygen (e.g. $O_2$, $H_2O$, $N_2O$) and a source of nitrogen (e.g. $N_2H_4$, $NH_3$, $HN_3$, $CH_3NHNH_2$, $(CH_3) NNH_2$) or a source of both oxygen and nitrogen (NO, $NH_2OH$, $N_2H_4H_2O$) on hot glass at a temperature of 500° C. to 600° C.

However, although there is a requirement for a suitable iridescence reducing underlayer, the underlayers proposed in GB patent no. 2 031 756B have not been used commercially to any significant extent. This may be because of difficulties, in particular the long deposition time required, in producing underlayers of sufficient quality and thickness by the known methods.

GB patent specification no. 2 163 146A is concerned with the production of barrier coatings on a glass surface to prevent migration of alkali metal ions from the glass into an overlying layer sensitive to alkali metal ions, for example indium tin oxide. It describes the production of transparent barrier coatings, having good light transmission and excellent barrier properties by pyrolysis of silane on a hot glass surface above 600° C. in the presence of a gaseous electron donating compound; the presence of the electron donating compound is found to result in incorporation of oxygen from glass into the coating so forming a transparent barrier coating up to 50 nm thick on the glass surface.

The electron donating compounds which may be used in the process of GB patent specification no. 2 163 146A are compounds which contain, either in bonds or as lone pair electrons, electrons which can be donated into the electronic structure of suitable acceptor molecules. The use of the electron donating compound is found to result in the incorporation of oxygen from the glass with silicon from the silane to form the transparent barrier coating on the glass. Although the mechanism is not understood, it is believed to involve adsorption of the electron donating compound on the glass surface. It is preferred to use an electron donating compound which is oxygen free, for example ethylene, or which, although it contains some oxygen, is generally regarded as reducing, for example carbon monoxide and alcohols.

Because the transparent barrier coatings may be prepared in the absence of free oxygen and compounds generally regarded as oxidising agents, the barrier coating may be applied to a ribbon of float glass as it is advanced over the molten metal bath on which it is formed without undue risk of oxidising the molten metal.

Unfortunately, while the use of oxygen free electron donating compound alleviates the risk of the silane being oxidised before it reaches the glass surface and of the reactant gas oxidising a molten metal bath on which the glass ribbon is supported, there is insufficient oxygen availability from the glass for the formation of the thicker iridescence reducing underlayers recommended in GB patent 2 031 756B. While thicker layers may be produced by using oxygen-containing electron donating compounds, for example carbon dioxide, it is found that the use of a combination of silane and carbon dioxide results in either thin coatings of poor durability or, when attempts are made to thicken the coatings, a white hazy deposit.

Moreover, when attempts are made to produce barrier coatings of very high transparency (e.g. a light transmission not less than 2% below that of the base glass) using a combination of silane and ethylene in accordance with GB 2 163 146A, the barrier properties of the coatings were found to be insufficiently consistent for some applications.

There is a need for a process, suitable for commercial operation on a float glass production line, for producing an iridescence reducing underlayer as recommended in GB patent 2 031 756B. There is also a need for a process, suitable for commercial operation on a float glass production line, for producing coatings which are effective as barriers to the migration of alkali metal ions from the glass and have a very high degree of transparency.

BRIEF SUMMARY OF THE INVENTION

It has now been found that these needs can be met by a process in which a gaseous mixture of a silane, an ethylenically unsaturated hydrocarbon and carbon dioxide is directed on to a hot glass surface to deposit a coating containing silicon and oxygen on the glass surface.

According to the present invention there is provided a process for forming a useful underlayer on a glass surface comprising directing on to the hot glass surface at a temperature of 600° C. to 750° C. a gaseous mixture of a silane, an unsaturated hydrocarbon compound and carbn dioxide thereby depositing a transparent layer containing silicon and oxygen on the glass surface.

Underlayers produced by the process of the invention act as barriers to the migration of alkali metal ions from the glass and are useful when an overlying layer, sensitive to the migration of alkali metal ions from the glass, is applied directly or indirectly over the underlayer. According to a further aspect of the invention, the process additionally comprises the step of applying a layer, sensitive to the migration of alkali metal ions from the glass, over the underlayer.

To produce an infra-red reflecting and/or electrically conducting coating of reduced iridescence, an infra-red reflecting and/or electrically conducting layer is deposited over the underlayer. Thus, according to a still further aspect of the invention, the process additionally comprises the step of depositing an infra-red reflecting and/or electrically conducting layer over the underlayer. This overlayer may be of a semiconductor metal oxide, for example tin doped indium oxide or doped tin oxide, especially fluorine doped tin oxide.

DETAILED DESCRIPTION OF THE INVENTION

Both the underlayer and the overlayer may be applied to float glass on the production line on which it is made. In this case the overlayer may be a fluorine doped tin oxide layer deposited by pyrolytic decomposition from a solid (as described, for example, in GB patent specification 2 156 386B), liquid (as described, for example, in GB patent specification 1 523 991) or vapour source (for example, gaseous stannic chloride in the presence of water vapour and hydrogen fluoride). The decomposition may be carried out in the entrance to the lehr.

When the coating is to be used as an infra-red reflecting coating, the infrared reflecting layer will usually have a thickness in the range 200 nm to 500 nm. Thicker layers, for example up to 1000 nm, may be used if desired but are generally unnecessary in view of the iridescence reducing properties of the underlayer. When the coating is to carry an electrical current, for example in a resistance heater or a liquid crystal display, the thickness of the coating will depend on the electrical conductivity required but will typically be in the range 100 nm to 1000 nm.

The silane is preferably monosilane ($SiH_4$), although other substituted or unsubstituted silanes in gaseous form e.g. dimethylsilane $(CH_3)_2SiH_2$ and disilane $Si_2H_6$, may be used if desired.

The unsaturated hydrocarbon may be an ethylenically unsaturated hydrocarbon compound, an acetylenically unsaturated compound (for example acetylene) or an aromatic compound (for example toluene), although it is generally most convenient to use an unsaturated hydrocarbon which is gaseous under ambient conditions. The unsaturated hydrocarbon is preferably an olefin, conveniently an olefin containing 2 to 4 carbon atoms. Ethylene is especially preferred.

The proportions of the component gases present in the gaseous mixture and the flow rate of the gaseous mixture over the glass may be regulated to provide an underlayer of a desired thickness and refractive index.

The carbon dioxide acts as a source of oxygen so that, although there is only limited availability of oxygen from the glass surface, transparent layers having a thickness up to 80 nm as taught by GB patent 2 031 756B can readily be achieved. Moreover, by appropriate regulation of the relative proportions of the component gases present, an underlayer having a refractive index in the range 1.7 to 1.8 taught by GB patent 2 031 756B can be achieved. In a preferred aspect of the invention, the proportions of the component gases present in the gaseous mixture used to deposit the underlayer and the flow rate of the gaseous mixture over the hot glass are regulated to deposit an underlayer having a thickness in the range 60 nm to 80 nm and a refractive index in the range 1.6 to 1.8.

In another embodiment of the invention, the proportions of the component gases present in the gaseous mixture used to deposit the underlayer and the flow rate of the gaseous mixture over the hot glass are regulated to deposit an underlayer which has a thickness and refractive index such that the glass coated with the underlayer has a light transmission within 2% of the light transmission of the uncoated glass and which provides an effective barrier to migration of alkali metal ions from the glass. The light transmission of the coated glass is preferably within 1% of the light transmission of the base glass. By the expression "effective barrier" it is meant that, on testing by the method described herein, the underlayer allows the passage of not more than 100 (and preferably not more than 60) micrograms of sodium expressed as $Na_2O$ per square decimeter of glass.

The main requirement for barrier layers is on thin glass so that, when an underlayer is deposited in accordance with the invention for use as a barrier layer, it is usually applied to flat glass having a thickness of up to 2 mm.

Some of the coatings produced by the present invention meet the criteria for both the preferred colour suppressing underlayers and the preferred barrier layers. However, while the preferred colour suppressing underlayers may have a thickness in the range 60 nm to 80 nm (measured as herein described) and a refractive index in the range 1.6 to 1.8, the preferred underlayers for use as barrier layers have a refractive index below 1.65 (in order to provide the required high light transmission) and may have a much lower thickness. However, they are preferably at least 20 nm thick to provide a good blocking performance.

In general, the higher the ratio of unsaturated hydrocarbon to silane, the thinner the coatings and the lower the refractive index of the coating. It is generally preferred to operate at a ratio of unsaturated hydrocarbon: silane in the range 2:1 to 5:1 by volume, although ratios outside this range, for example, 1:1 to 8:1 (or even higher) may be used. The unsaturated hydrocarbon is believed to act by being adsorbed on the glass surface so that, in general, the more strongly the unsaturated hydrocarbon is adsorbed on the glass, the lower the proportion of unsaturated hydrocarbon to silane is required for a given affect. Increasing the ratio of carbon dioxide to silane while maintaining the ratio of unsaturated hydrocarbon to silane constant reduces the refractive index of the coating and may enable thicker coatings to be obtained although it has been observed, under certain conditions, to reduce the thickness of the coating. The ratio of carbon dioxide to silane is preferably in the range 2:1 to 8:1 by volume, although ratios outside this range, for example 1:1 to 20:1 (or even higher) may be used. The higher ratios will generally only be used when operating at very low silane concentrations.

The gaseous mixture used will generally contain an inert carrier gas, for example nitrogen, in an amount of, for example, 10% to 90% by volume of the gaseous mixture.

Increasing the total flow rate of a gaseous mixture of given composition results, as might be expected, in an underlayer of increased thickness. It has also been found to result in an underlayer of higher refractive index.

The glass is preferably at a temperature in the range 630° C. to 720° C.

The process of the present invention facilitates the on-line production of iridescence reducing underlayers and underlayers which serve as a barrier to the migration of alkali metal ions and have a very high degree of transparency to visible light. Moreover, as the reactants used are not strongly oxidising the process can be applied to a ribbon of float glass as it is advanced over the molten metal bath on which it is formed without undue risk of oxidising the molten metal.

The invention is illustrated but not limited by the following Examples. In the Examples, all percentages are by volume unless otherwise indicated, and the gas flow rates are measured at 69 kPa (10 psi) and approximately 20° C. The refractive index and thickness values quoted for the underlayer are calculated, applying thin film theory, from the wavelength and magnitude of maximum reflection of the underlayer. The light transparency of the coated glass is expressed as dT, which is the difference between the percentage light transmission of the glass coated with the underlayer and the percentage light transmission of the uncoated glass. The effectiveness of the underlayers as barrier layers to the migration of alkali metal ions was determined by the following procedure. Two samples of the coated glass, each 10 cm square, were cut and clamped together with an annular silicone rubber ring of internal diameter 8.5 cm between them to form a cylindrical cell with its walls defined by the coated surface of the glass and the inner surface of the silicone rubber ring. The cell was filled with de-ionised water through a hole in the rubber ring, the hole sealed and the sealed cell immersed in a water bath at 96° C. for 48 hours. The solution was removed and analysed for sodium by flame emission spectroscopy. The sodium extract was determined and expressed as micrograms of $Na_2O$ per square decimeter of glass exposed to the water in the cell.

EXAMPLE 1

A ribbon of 6 mm float glass advancing at a lehr speed of 322 meters per hour was coated with an underlayer by applying a gaseous mixture to the upper surface of the glass as it advanced over the float bath at a position where the glass temperature was about 645° C. The gaseous mixture comprised 11% monosilane, 23% ethylene, 23% carbon dioxide and 44% nitrogen as a carrier gas. The gaseous mixture was caused to flow parallel to the glass surface in the direction of movement of the glass under laminar flow conditions using an apparatus as described in G.B. patent specification 1 507 966, modified to extend the path of travel of the gaseous mixture over the glass surface to approximately 0.2 m. The flow rate of the gaseous mixture was 22 liters per minute per meter width of glass coated.

A clear, substantially haze free, underlayer was formed on the glass surface with a thickness of 76.1 nm and a refractive index of 1.77.

EXAMPLES 2 AND 3

The procedure of Example 1 was repeated with an increased ratio of flow of ethylene and carbon dioxide. This resulted in a small reduction in both the thickness and refractive index of the layer formed. The conditions used and results obtained are set out in Table 1, with corresponding details for Example 1 for comparison.

EXAMPLES 4 TO 8

The procedure of Example 1 was repeated using different gaseous mixtures and varying the proportion of ethylene to carbon dioxide while maintaining both the proportion of monosilane:ethylene plus carbon dioxide and the total gas flow rate constant. The conditions used and results obtained are set out in Table 2.

The use of a high ratio of ethylene:silane, as in Examples 4 and 5, results in a very thin underlayer (less than 55 nm). Reducing the ratio of ethylene:silane and increasing the ratio of carbon dioxide:silane initially leads to an increase in thickness of the underlayer (Examples 6 and 7), but the thickness of the underlayer is reduced when the ratio of carbon dioxide:silane increases to 8:1.

EXAMPLES 9 TO 13

The procedure of Example 1 was repeated using a gaseous mixture containing 10% monosilane, 25% ethylene, 25% carbon dioxide and 40% nitrogen at different total flow rates. The results are shown in Table 3 (Examples 9 to 11). It is found that both the thickness and the refractive index of the underlayer increases with increasing total flow rate.

The procedure of Example 9 was repeated using the same flow rates of silane, ethylene and carbon dioxide with increasing flows of nitrogen. The flow rates used and characteristics of the underlayers produced are shown in Table 3. (Examples 9, 13 and 14). It was found that the thickness of the underlayer decreased, while its refractive index increased, with increased nitrogen flow.

EXAMPLES 14 TO 19

In these Examples, carried out in a similar manner to Example 1, underlayers were produced on 6 mm float glass under conditions set out in Table 4, and found to have the refractive indices and thicknesses shown in that Table. Fluorine doped tin oxide layers were then deposited on the float glass ribbon over the underlayer as it entered the lehr by chemical vapour deposition from a gaseous mixture of stannic chloride, water and hydrogen fluoride. The thickness of the tin oxide layers was measured, and the colour co-ordinates of light (C.I.E. Illuminant C) reflected from the coated side of the glass were measured and, in the case of Examples 14 to 17, compared with the colour co-ordinates of light reflected from similar fluorine doped tin oxide coatings without the underlayer. (The use of colour co-ordinates to define colours is described in "The Measurement of Appearances" by R. S. Hunter, published by John Wiley & Sons, 1975). The results obtained are shown in Table 5.

It will be seen that the effect of the underlayers is to suppress the reflection colour of the tin oxide layers.

EXAMPLES 20–23

The procedure of Example 1 was repeated using a gaseous mixture containing 10% silane, 20% ethylene, 30% carbon dioxide and 40% nitrogen flowing at a rate of 50 liters per minute per meter of glass coated over a ribbon of 2.1 mm glass advancing at a lehr speed of 1130 meters per hour. The gaseous mixture was passed over the glass at a position where the glass temperature was about 645° C.

The glass was found to be coated with a layer having a high degree of transparency, the coated glass having a light transmission only 1.1% less than that of the uncoated glass. The effectiveness of the layer as a barrier to the migration of alkali was measured as 90 microgram of $Na_2O$ per square decimeter of glass (see above).

The procedure was repeated using different gas compositions on 6 mm and 4 mm glass. The glass temperature at the coating station, the lehr speed of the ribbon, the gas composition and flow rate used, together with the properties of the coated product are shown in Table 6. Comparing Examples 21 and 22, it will be seen that the increase in glass temperature and silane concentration, and the reduction in the ratios of ethylene and carbon dioxide to silane, more than compensated for the reduction in gas flow (from 55 to 24 liters/minute/meter), so that the coating formed in Example 22 was approximately twice as thick as the coating of Example 21. All the Examples showed a good barrier performance, but the underlayer of Example 22 gave the highest light transmission (relative to the light transmission of the uncoated glass).

EXAMPLES 24 TO 30

These Examples illustrate the use of butene as the unsaturated hydrocarbon, with silane and carbon dioxide, to produce colour suppressing underlayers and barrier layers in accordance with the invention. The Examples were carried out by the procedure described in Example 1, but coating only a narrow strip of glass at the edge of the ribbon. The glass was 6 mm thick, was moving at a lehr speed of 360 meters/hour and was coated at a position where its temperature was 685° C. The conditions, gas composition and gas flow rates used, and the properties of the underlayers produced, are set out in Table 7.

Satisfactory colour suppressing layers were produced with a thickness in the range 60 nm to 80 nm and a refractive index in the range 1.6 to 1.8 in Examples 25 to 27 (and marginally outside those ranges in Example 24). Examples 28 to 30, which were carried out at lower gas flow rates, resulted in thinner coatings having an excellent barrier performance with the coated glass having a light transmission close to that of the uncoated glass. Comparing Examples 24 to 30 with the earlier Examples, it will be noted that higher overall gas flows were apparently required to produce coatings of similar thickness. It is believed that this is due, at least in part, to the process of Examples 24 to 30 being carried out on a narrower strip of glass with significant escape of gas away from the sides of the strip being coated.

EXAMPLES 31 TO 36

Static samples of 3 mm float glass, 10 cm by 10 cm, were coated in the laboratory by heating the glass in a silica tube at a temperature of about 650° C. and passing a coating gas comprising a mixture of silane, carbon dioxide, an unsaturated hydrocarbon and nitrogen over the hot glass surface. The gas compositions used and treatment times are shown in Table 8, together with the results of measurements on the light transmission and barrier properties of the coated products. With each of the unsaturated hydrocarbon gases used, a good barrier performance was achieved with a high degree of transparency (within 1% of the transparency of the uncoated glass).

EXAMPLES 37 TO 40

The procedures of Example 1 was repeated using a gaseous mixture of silane, ethylene and carbon dioxide in nitrogen to coat 2 mm float glass advancing at a lehr speed of 1100 meters/hour.

The light transmission of the glass was measured and compared with the light transmission of the uncoated glass to give the difference dT, and the barrier performance of the glass was measured as described above. The thickness of the coatings was too small for measurement by the optical method described above, and was measured by an argon ion etching technique.

The coating conditions and results obtained are shown in Table 9.

Examples 37 to 40 all illustrate the production of barrier layers, such that the coated glass has a light transmission within 1.5% of the light transmission of the uncoated glass (dT). The final comparative Example shows that, in the absence of carbon dioxide, the light transmission is significantly lower (dT=2.3%), although the underlayer is in fact thicker than the underlayers produced in Examples 37 and 39. A comparison of Examples 37 and 38 indicates that increasing the ratio of dopants (ethylene and carbon dioxide) to silane has reduced the underlayer thickness, with a consequent improvement in light transmission but a reduction in barrier performance. A small reduction in the ratio of dopants to silane (compare Examples 37 and 39) has reduced the light transmission, while leaving the thickness and barrier performance unchanged. Reducing the ethylene and increasing the carbon dioxide substantially (Example 40), reduces the thickness and increases the light transmission but leads to a substantial reduction in barrier performance.

The foregoing Examples show that, by regulating the proportions of the component gases present in the gaseous mixture used in the process of the invention and the flow rate of the gaseous mixture over the hot glass surface, underlayers of a desired thickness and refractive index may be produced. Thus the process of the invention is useful not only for producing colour suppressing underlayers of the kind described in GB patent 2,031,756B, but also for producing other colour suppressing underlayers known in the art, as well as underlayers with a high degree of transparency useful for their barrier properties.

TABLE 1

| Example | Lehr speed of glass ribbon (meters/hour) | Glass temperature | Gas Composition (%) | | | | Gas Flow (liters/minute meter width) | Underlayer | |
|---|---|---|---|---|---|---|---|---|---|
| | | | $SiH_4$ | $C_2H_4$ | $CO_2$ | $N_2$ | | Refractive Index | Thickness (nm) |
| 1 | 322 | 645° C. | 11 | 23 | 23 | 44 | 22 | 1.77 | 76.1 |
| 2 | 322 | 645° C. | 9 | 28 | 28 | 37 | 26.25 | 1.70 | 73.7 |
| 3 | 322 | 645° C. | 8 | 29 | 29 | 33 | 29 | 1.63 | 73.6 |

TABLE 2

| Example | Lehr speed of glass ribbon (meters/hour) | Glass temperature | Gas composition (%) SiH$_4$ | C$_2$H$_4$ | CO$_2$ | N$_2$ | Gas flow (liters/minute meter width) | Underlayer Refractive Index | Thickness (nm) |
|---|---|---|---|---|---|---|---|---|---|
| 4 | 296 | 630° C. | 7 | 53 | 13 | 27 | 45 | Too thin to measure optically | |
| 5 | 296 | 630° C. | 7 | 44 | 22 | 27 | 45 | | |
| 6 | 296 | 630° C. | 7 | 33 | 33 | 27 | 45 | 1.64 | 72.4 |
| 7 | 296 | 630° C. | 7 | 22 | 44 | 27 | 45 | 1.68 | 78.9 |
| 8 | 296 | 630° C. | 7 | 13 | 53 | 27 | 45 | 1.83 | 55.8 |

TABLE 3

| Example | Lehr speed of glass ribbon (meters/hour) | Glass temperature | Gas Composition (%) SiH$_4$ | C$_2$H$_4$ | CO$_2$ | N$_2$ | Gas Flow (liters/minute meter width) | Underlayer Refractive Index | Thickness (nm) |
|---|---|---|---|---|---|---|---|---|---|
| 9 | 331 | 640° C. | 10 | 25 | 25 | 40 | 20 | 1.63 | 76.0 |
| 10 | 331 | 640° C. | 10 | 25 | 25 | 40 | 24 | 1.69 | 81.9 |
| 11 | 331 | 640° C. | 10 | 25 | 25 | 40 | 30 | 1.74 | 82.5 |
| 12 | 331 | 640° C. | 9 | 22 | 22 | 48 | 23 | 1.69 | 71.8 |
| 13 | 331 | 640° C. | 8 | 19 | 19 | 54 | 26 | 1.74 | 66.8 |

TABLE 4

| Example | Lehr speed of glass ribbon (meters/hour) | Glass temperature | Gas Composition (%) SiH$_4$ | C$_2$H$_4$ | CO$_2$ | N$_2$ | Gas Flow (liters/minute meter width) | Underlayer Refractive Index | Thickness (nm) |
|---|---|---|---|---|---|---|---|---|---|
| 14 | 360 | 650° C. | 9 | 22 | 22 | 47 | 18.5 | 1.69 | 70.3 |
| 15 | 360 | 650° C. | 8 | 24 | 24 | 45 | 21 | 1.71 | 68.0 |
| 16 | 360 | 650° C. | 8 | 24 | 24 | 45 | 21 | 1.71 | 68.0 |
| 17 | 360 | 650° C. | 9 | 29 | 29 | 34 | 21 | 1.65 | 75.0 |
| 18 | 360 | 690° C. | 9 | 31 | 31 | 29 | 38 | 1.77 | 67.7 |
| 19 | 360 | 680° C. | 10 | 25 | 25 | 40 | 16 | 1.77 | 64.0 |

TABLE 5

| Example | Thickness of tin oxide (nm) | Colour co-ords a | b | Colour co-ords (without underlayer) a | b |
|---|---|---|---|---|---|
| 14 | 350 | +2.2 | +0.6 | −16 | +10 |
| 15 | 300 | −1.5 | +2.3 | +10 | −21 |
| 16 | 320 | −0.1 | +4.6 | −9 | −9 |
| 17 | 250 | +2.7 | +1.2 | +5 | +11 |
| 18 | 350 | −0.8 | +2.2 | | |
| 19 | 350 | +0.3 | +1.6 | | |

TABLE 6

| Example | Lehr speed of ribbon (meters/hour) | Glass temp | Glass thickness (mm) | Gas composition (%) SiH$_4$ | C$_2$H$_4$ | CO$_2$ | N$_2$ | Gas flow (liters/minute meter width) | Underlayer Refractive Index | Thickness (nm) | dT % | Mg Na$_2$O/sq dm |
|---|---|---|---|---|---|---|---|---|---|---|---|---|
| 21 | 300 | 650° C. | 6 | 6 | 36 | 36 | 22 | 55 | 1.6 | 34.6 | 0.3 | 26 |
| 22 | 380 | 670° C. | 6 | 8 | 21 | 21 | 50 | 24 | 1.65 | 68.0 | >2 | 30 |
| 23 | 550 | 690° C. | 4 | 11 | 28 | 28 | 33 | 27 | 1.6 | 60 | 2 | 13 |

TABLE 7

| Example | Lehr speed of ribbon (meters/hour) | Glass temp | Gas composition (%) SiH$_4$ | C$_3$H$_6$ | CO$_2$ | N$_2$ | Gas flow (liters/minute meter width) | Underlayer Refractive Index | Thickness (nm) | dT % | Mg Na$_2$O/sq dm |
|---|---|---|---|---|---|---|---|---|---|---|---|
| 24 | 360 | 685° C. | 6.2 | 34.4 | 34.4 | 25 | 75 | 1.82 | 59.2 | 7.6 | |
| 25 | 360 | 685° C. | 5.9 | 35.3 | 35.3 | 23.5 | 75 | 1.76 | 60.0 | 5.4 | |
| 26 | 360 | 685° C. | 5.0 | 37.5 | 37.5 | 20 | 80 | 1.73 | 63.6 | 4.4 | |
| 27 | 360 | 685° C. | 5.9 | 35.3 | 35.3 | 23.5 | 68 | 1.74 | 64.5 | 5.5 | |
| 28 | 360 | 685° C. | 5.9 | 35.3 | 35.3 | 23.5 | 34 | | | <0.1 | 14 |
| 29 | 360 | 685° C. | 5.9 | 35.3 | 35.3 | 23.5 | 51 | | | 0.8 | 14 |
| 30 | 360 | 685° C. | 5.0 | 37.5 | 37.5 | 20 | 40 | | | 0.1 | 28 |

TABLE 8

| Example | monosilane % | unsaturated hydrocarbon | carbon dioxide % | nitrogen % | coating time (seconds) | dT % | Mg Na₂O/ sq dm |
|---|---|---|---|---|---|---|---|
| 31 | 2.5 | 3.3% acetylene | 8.5 | 85.2 | 35 | 2.8 | 18 |
| 32 | 2.7 | 3.9% acetylene | 4.4 | 89.0 | 15 | <0.2 | 13 |
| 33 | 0.9 | 2.9% toluene* | 31.6 | 64.6 | 15 | <0.1 | 13 |
| 34 | 0.9 | 2.9% toluene* | 31.6 | 64.6 | 20 | 0.6 | 13 |
| 35 | 1.6 | 6.6% heptene* | 26.2 | 65.6 | 35 | 0.4 | 13 |
| 36 | 1.6 | 2.6% octene* | 29.3 | 66.5 | 20 | 0.2 | 13 |

*The gas was obtained by bubbling nitrogen through the liquid unsaturated hydrocarbon and the amount of unsaturated hydrocarbon present in the gaseous mixture calculated from the known vapour pressure of the liquid assuming a bubbler efficiency of 50% i.e. that the nitrogen bubbled through the liquid hydrocarbon became 50% saturated with the hydrocarbon vapour.

TABLE 9

| Example | Lehr speed of ribbon (meters/hour) | Glass temp | Gas composition (%) SiH₄ | C₂H₄ | CO₂ | N₂ | Gas flow (liters/minute meter width) | Underlayer Thickness (nm) | dT % | Mg Na₂O/ sq dm |
|---|---|---|---|---|---|---|---|---|---|---|
| 37 | 1100 | 655° C. | 9.7 | 25.7 | 25.7 | 39.0 | 62 | 17 | 0.9 | <20 |
| 38 | 1100 | 655° C. | 8.6 | 28.7 | 28.7 | 34.0 | 70 | 11 | 0.25 | 62 |
| 39 | 1100 | 655° C. | 11.1 | 22.0 | 22.0 | 45.0 | 54 | 17 | 1.5 | >20 |
| 40 | 1100 | 655° C. | 4.0 | 2.0 | 80.0 | 14.0 | 102 | 7 | 0.2 | 200 |
| comparative | 1100 | 655° C. | 11.8 | 42.0 | 0 | 46.0 | 52 | 14 | 2.3 | >20 |

We claim:

1. A process for forming an underlayer on a glass surface comprising directing on to the hot glass surface at a temperature of 600° C. to 750° C. a gaseous mixture of a silane, an unsaturated hydrocarbon compound and carbon dioxide thereby depositing a transparent layer containing silicon and oxygen on the glass surface.

2. A process according to claim 1 which additionally comprises the step of applying a layer sensitive to the migration of alkali metal ions from the glass over the underlayer.

3. A process according to claim 1 which additionally comprises the step of depositing an infra-red reflecting layer over the underlayer.

4. A process according to claim 1 which additionally comprises the step of depositing an electrically conducting layer over the underlayer.

5. A process according to claim 1 wherein the unsaturated hydrocarbon compound used in depositing the underlayer is an olefin containing 2 to 4 carbon atoms.

6. A process according to claim 5 wherein the unsaturated hydrocarbon compound is ethylene.

7. A process according to claim 2 wherein the proportions of the component gases present in the gaseous mixture used to deposit the underlayer and the flow rate of the gaseous mixture over the hot glass surface are regulated to deposit an underlayer which has a thickness and refractive index such that the glass coated with the underlayer has a light transmission within 2% of the light transmission of the uncoated glass and which provides an effective barrier, as herein defined, to migration of alkali metal ions from the glass.

8. A process according to claim 3 wherein the proportions of the component gases present in the gaseous mixture used to deposit the underlayer and the flow rate of the gaseous mixture over the hot glass surface are regulated to deposit an underlayer having a thickness in the range 60 nm to 80 nm and a refractive index in the range 1.6 to 1.8.

9. A process according to claim 1 wherein the ratio of unsaturated hydrocarbon to silane in the gaseous mixture used to deposit the underlayer is in the range 2:1 to 5:1 by volume.

10. A process according to claim 1 wherein the ratio of carbon dioxide to silane in the gaseous mixture used to deposit the underlayer is in the range 2:1 to 8:1 by volume.

11. A process of forming an underlayer on a glass surface which underlayer acts as a barrier to migration of alkali metal ions from the glass comprising directing on to a hot glass surface at a temperature of 600° C. to 750° C. a gaseous mixture of a silane, an unsaturated hydrocarbon compound and carbon dioxide, the proportions of the component gases present in the gaseous mixture being regulated within the ranges unsaturated hydrocarbon to silane 1:1 to 8:1 and carbon dioxide to silane 1:1 to 20:1 whereby an underlayer is deposited which has a thickness and refractive index such that the glass coated with the underlayer has a light transmission within 2% of the light transmission of the uncoated glass and which provides an effective barrier, as herein defined, to migration of alkali metal ions from the glass.

12. A process according to claim 11 wherein the glass has a thickness of up to 2 mm.

13. A process according to claim 12 which additionally comprises the step of applying a layer sensitive to the migration of alkali metal ions from the glass over the underlayer.

14. A process according to claim 12 wherein the unsaturated hydrocarbon used in depositing the underlayer is an olefin containing two to four carbon atoms.

15. A process according to claim 14 wherein the unsaturated hydrocarbon is ethylene.

16. A process of forming a colour suppressing underlayer on a glass surface comprising directing on to a hot glass surface at a temperature of 600° C. to 750° C. a gaseous mixture of a silane, an unsaturated hydrocarbon compound and carbon dioxide, the proportions of component gases present in the gaseous mixture being regulated within the ranges unsaturated hydrocarbon to silane 1:1 to 8:1 and carbon dioxide to silane 1:1 to 20:1 whereby an underlayer having a thickness in the range 60 nm to 80 nm and a refractive index in the range 1.6 to 1.8 is deposited on the glass.

17. A process according to claim 16 which additionally comprises the step of depositing an infra-red reflecting layer over the underlayer.

18. A process according to claim 16 wherein the unsaturated hydrocarbon used in depositing the underlayer is an olefin containing two to four carbon atoms.

19. A process according to claim 18 wherein the unsaturated hydrocarbon compound is ethylene.

* * * * *